(12) United States Patent
Kim et al.

(10) Patent No.: US 9,461,226 B2
(45) Date of Patent: Oct. 4, 2016

(54) THERMOELECTRIC MATERIAL AND METHOD OF PREPARING THE SAME

(75) Inventors: Hyun-sik Kim, Gyeonggi-do (KR); Kyu-hyoung Lee, Yongin-si (KR); Sang-mock Lee, Yongin-si (KR); Eun-sung Lee, Seoul (KR); Xiangshu Li, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 954 days.

(21) Appl. No.: 12/953,993

(22) Filed: Nov. 24, 2010

(65) Prior Publication Data

US 2011/0247671 A1 Oct. 13, 2011

(30) Foreign Application Priority Data

Apr. 8, 2010 (KR) .................... 10-2010-0032287

(51) Int. Cl.
*H01L 35/16* (2006.01)
*H01L 35/18* (2006.01)
*B82Y 30/00* (2011.01)
*H01L 35/26* (2006.01)
*H01L 35/02* (2006.01)
*H01L 35/00* (2006.01)

(52) U.S. Cl.
CPC .............. *H01L 35/16* (2013.01); *B82Y 30/00* (2013.01); *H01L 35/18* (2013.01); *H01L 35/26* (2013.01); *H01L 35/00* (2013.01); *H01L 35/02* (2013.01)

(58) Field of Classification Search
CPC ....... B82Y 30/00; H01L 35/00; H01L 35/16; H01L 35/26
USPC .......................... 136/238; 252/512; 977/773
See application file for complete search history.

(56) References Cited

U.S. PATENT DOCUMENTS

| | | | |
|---|---|---|---|
| 2006/0102224 A1* | 5/2006 | Chen et al. | 136/203 |
| 2006/0249704 A1* | 11/2006 | Ren et al. | 252/62.3 T |
| 2008/0202575 A1* | 8/2008 | Ren et al. | 136/201 |
| 2009/0218551 A1* | 9/2009 | Sengupta et al. | 252/512 |

FOREIGN PATENT DOCUMENTS

| | | |
|---|---|---|
| JP | 09036437 A | 2/1997 |
| JP | 2002033527 A | 1/2002 |
| JP | 2003095741 A | 4/2003 |
| JP | 2007021670 A | 2/2007 |
| JP | 2007042963 A | 2/2007 |
| JP | 2007243070 A | 9/2007 |
| JP | 2009054968 A | 3/2009 |
| KR | 1020050121189 A | 12/2005 |
| KR | 1020070108853 A | 11/2007 |
| KR | 1020090110831 A | 10/2009 |

\* cited by examiner

*Primary Examiner* — Matthew Martin
(74) *Attorney, Agent, or Firm* — Cantor Colburn LLP

(57) ABSTRACT

A thermoelectric material including: a bismuth-tellurium (Bi—Te)-based thermoelectric material matrix; and a nano-metal component distributed in the Bi—Te-based thermoelectric material matrix, wherein a Lotgering degree of orientation in a c-axis direction is about 0.9 to about 1.

13 Claims, 9 Drawing Sheets

THERMOELECTRIC MATERIAL AND METHOD OF PREPARING THE SAME

CROSS-REFERENCE TO RELATED APPLICATIONS

This application claims priority to Korean Patent Application No. 10-2010-0032287, filed on Apr. 8, 2010, and all the benefits accruing therefrom under 35 U.S.C. §119, the content of which in its entirety is herein incorporated by reference.

BACKGROUND

1. Field

The present disclosure relates to thermoelectric materials and methods of preparing the same, and more particularly, to thermoelectric materials having a high degree of orientation and methods of preparing the thermoelectric materials.

2. Description of the Related Art

Thermoelectric materials allow creation of a voltage, when there is a different temperature on each side of the material, based on the thermoelectric effect. The thermoelectric effect refers to direct conversion of a temperature difference into an electric voltage and vice versa, caused by migration of charge carriers, specifically, electrons and holes, in a material. The Seebeck effect, which is a conversion of a temperature difference directly to electricity, may be applied to provide a power generation system by using an electromotive force created by a temperature difference between two ends of a material. The Peltier effect, which is a phenomenon wherein heat is evolved at an upper junction and absorbed at a lower junction when a current flows through a circuit, may be applied to provide a cooling system by using a temperature difference between two ends of a material, wherein the temperature difference is formed by supplying current to the material. The Seebeck effect and the Peltier effect are different from Joule heating in that the Seebeck effect and the Peltier effect are thermodynamically reversible.

Currently, thermoelectric materials may be applied to active cooling systems of semiconductor equipment or electronic devices in which thermal management may not be entirely addressed using a passive cooling system. Further, there is an increasing demand for thermoelectric devices in fields wherein thermal management may not be entirely solved by existing refrigerant-based gas compression systems, such as precision temperature control systems applied to DNA analysis. Thermoelectric cooling is an environmentally friendly cooling technology that does not cause vibration or noise and does not use a refrigerant gas, which causes environmental problems. High-efficiency thermoelectric cooling materials may be applied to commercially available cooling systems such as refrigerators and air conditioners. Thermoelectric materials are regarded as a potential reproducible energy source, because if a thermoelectric material is applied to heat dissipating parts of automotive engines, industrial plants, or the like, power may be generated due to a temperature difference between ends of the thermoelectric material. Such thermoelectric power generation systems have already been used in spacecraft travelling to Mars, Saturn, and regions in which solar energy is not available.

The performance of a thermoelectric material may be evaluated by using a dimensionless figure of merit ZT as defined by Equation 1 below.

$$ZT = S^2 \sigma T/\kappa \tag{1}$$

In Equation 1, S is the Seebeck coefficient of the material, $\sigma$ is the electrical conductivity of the material, T is the absolute temperature of the material, and $\kappa$ is the thermal conductivity of the material. As shown in Equation 1, in order to increase the dimensionless figure of merit ZT, the Seebeck coefficient S and the electrical conductivity $\sigma$, specifically, a power factor $S^2\sigma$, should be increased and the thermal conductivity k should be decreased. In particular, in order to increase the electrical conductivity $\sigma$ of the thermoelectric material, both high carrier concentration and high carrier mobility are desirable. Although the carrier concentration may be increased by selecting constituents of the thermoelectric material, if the carrier concentration is increased, the thermal conductivity k is also increased. Accordingly, because there is a limit to improving the thermoelectric performance by increasing the carrier concentration, it is more desirable to improve thermoelectric performance by increasing the carrier mobility, i.e., by increasing the electrical conductivity $\sigma$.

If the number of grain boundaries in the thermoelectric material is reduced, the proportion of carriers scattered at the grain boundaries is also reduced, thereby increasing the carrier mobility. The number of grain boundaries may be reduced by preparing a highly crystalline material (a single crystal would have no internal grain boundaries), or by increasing an average grain size of the thermoelectric material. Examples of well-known single crystal growth methods include a Bridgeman method, a Czochralski method, and a Zone melting method. However, because the aforesaid methods are difficult to control, take a lot of time, and because the mechanical strength of the thermoelectric material decreases as the average grain size increases, it is difficult to use the aforesaid methods to grow a single crystal.

In order to solve the above and other problems, attempts have been made to increase the carrier mobility by sintering a polycrystalline powder at a high temperature and pressure by using hot pressing, or the like, to increase the degree of orientation. However, high-pressure sintering methods, such as hot pressing, fail to provide a thermoelectric material having a sufficiently high degree of orientation as compared to a degree of orientation of a material including single crystals.

SUMMARY

Provided is a thermoelectric material having a high degree of orientation.

Provided is a method of preparing the thermoelectric material having a high degree of orientation.

Additional aspects, features, and advantages will be set forth in part in the description which follows and, in part, will be apparent from the description.

According to an aspect, disclosed is a thermoelectric material including: a bismuth-tellurium (Bi—Te)-based thermoelectric material matrix; and a nano-metal component distributed in the Bi—Te-based thermoelectric material matrix, wherein a Lotgering degree of orientation in a c-axis direction is about 0.9 to about 1.

The Bi—Te-based thermoelectric material matrix may be $Bi_{0.5}Sb_{1.5}Te_3$.

The nano-metal component may have a melting point which is lower than a melting point of the Bi—Te-based thermoelectric material matrix.

The nano-metal component may be lead (Pb), tin (Sn), or a combination including at least one of the foregoing.

The thermoelectric material may further include a plurality of grains having an average grain size greater than about 100 micrometers (μm) and less than about 5 millimeters (mm).

The plurality of the grains may be contained in an amount of about 90 to about 100 volume percent ("%"), based on the total volume of the thermoelectric material.

According to another aspect, there is provided a method of preparing a thermoelectric material, the method including: contacting a thermoelectric material matrix and a precursor of a nano-metal, which has a melting point which is lower than a melting point of the thermoelectric material matrix, to form a combination comprising the nano-metal; melting the combination; and recrystallizing the melted combination to form the thermoelectric material.

A ratio of the thermoelectric material matrix and the nano-metal may be such that the combination has a melting point equal to or less than about 500° C. and the thermoelectric material has an electrical conductivity of more than 2500 siemens per centimeter at 320 Kelvin.

The thermoelectric material matrix may be a Bi—Te-based material. The nano-metal may be Pb or Sn. The precursor of the nano-metal may be lead(II) acetate (Pb($CH_3COO$)$_2$) or tin(II) acetate (Sn($CH_3COO$)$_2$).

The melting of the combination may include melting the combination with a spark plasma sintering device.

The melting of the combination may include melting the combination in a vacuum.

BRIEF DESCRIPTION OF THE DRAWINGS

These and/or other aspects, features, and advantages will become apparent and more readily appreciated from the following description of the embodiments, taken in conjunction with the accompanying drawings in which.

DETAILED DESCRIPTION

Figure 1:
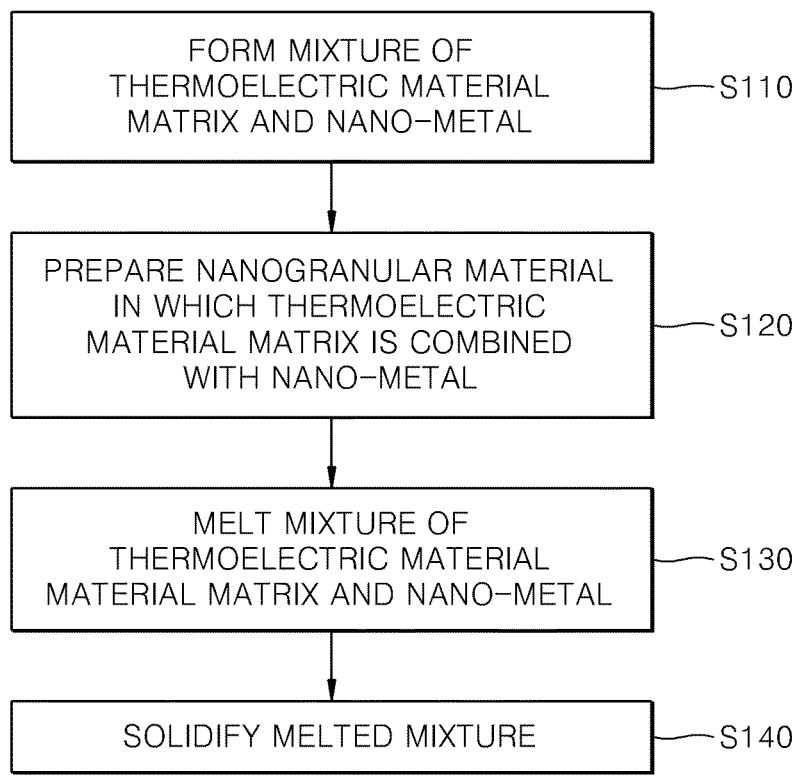
FIG. 1 is a flowchart illustrating an embodiment of a method of preparing a thermoelectric material.

The present invention will now be described more fully with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "combination" is inclusive of blends, mixtures, alloys, reaction products, and the like.

Herein, the term "degree of orientation" refers to the extent to which crystallographic directions of grains in a polycrystalline material are the same. It is known that as the degree of orientation of a thermoelectric material increases, charge carrier mobility increases and the electrical conductivity of the thermoelectric material increases. Herein, the term "grains" refers to individual crystals in a polycrystalline material. Degree of orientation may also be referred to as texture.

A Lotgering method is known to one of skill in the art and is widely used to measure the degree of orientation of crystals of a polycrystalline material. In the Lotgering method, a sum of X-ray diffraction strengths I(hkl) from each crystal surface hkl of an oriented polycrystalline sample is ΣI(hkl). A sum of X-ray diffraction strengths I(HKL) from a specific crystal surface HKL is ΣI(HKL). A ratio P of the sums is obtained by Equation 2.

$$P=\{\Sigma I(HKL)/\Sigma I(hkl)\} \quad (2)$$

Likewise, sums of X-ray diffraction strengths $\Sigma I_0(hkl)$ and $\Sigma I_0(HKL)$ of a non-oriented polycrystalline sample having the same composition as that of an oriented polycrystalline sample may be obtained, and a ratio $P_0$ of the sums is obtained by Equation 3.

$$P_O=\{\Sigma I_0(HKL)/\Sigma I_0(hkl)\} \quad (3)$$

The degree of orientation F is obtained by Equation 4. As shown in Equation 2 and Equation 3, P is a ratio of X-ray diffraction strengths of the oriented polycrystalline sample in a specific direction to X-ray diffraction strengths of the oriented polycrystalline sample in all directions, and $P_0$ is a ratio of X-ray diffraction strengths of the non-oriented polycrystalline sample in a specific direction to X-ray diffraction strengths of the non-oriented polycrystalline sample in all directions.

$$F=\{(P-P_O)/(1-P_O)\}\times 100\% \quad (4)$$

In an embodiment, the degree of orientation of an embodiment of a thermoelectric material, as measured by the Lotgering method, is greater than about 0.9. The degree of orientation of the thermoelectric material according to the present embodiment is similar to a degree of orientation of a single crystalline material and is much higher than a degree of orientation of a commercially available polycrystalline thermoelectric material, which is increased by high temperature and high pressure.

In an embodiment, the thermoelectric material may have a grain size (e.g., an average largest grain size) which is greater than about 100 micrometers (μm) and less than about 5 millimeters (mm), specifically a grain size of about 0.2 mm to about 3 mm, more specifically about 1 mm to about 2 mm. Also, a content of the grains having the foregoing size may be greater than about 90 volume percent (%), specifically about 91 to about 99.99 volume percent, more specifically about 92 to about 99 volume percent, based on the total volume of the thermoelectric material.

The thermoelectric material may include a bismuth-tellurium (Bi—Te)-based thermoelectric material matrix and a nano-metal component. The nano-metal component may comprise lead (Pb), tin (Sn), or a combination comprising at least one of the foregoing, and may be disposed on (e.g., distributed in) the Bi—Te-based thermoelectric material matrix. For example, the thermoelectric material may include $Bi_{0.5}Sb_{1.5}Te_3$ as the thermoelectric material matrix and Pb or Sn added to $Bi_{0.5}Sb_{1.5}Te_3$. Thus, in an embodiment, the thermoelectric material may comprise a bismuth-tellurium (Bi—Te)-based thermoelectric material matrix and lead. In another embodiment, the thermoelectric material may comprise a bismuth-tellurium (Bi—Te)-based thermoelectric material matrix and tin.

The high degree of orientation of the thermoelectric material may result from 90 percent of the grains having a same orientation in the thermoelectric material and a large grain size which is greater than 100 micrometers.

A method of preparing a thermoelectric material will now be disclosed in further detail.

An embodiment of the method of preparing a thermoelectric material includes melting a mixture of a thermoelectric material and a metal having a melting point that is lower than a melting point of the thermoelectric material, and recrystallizing the melted mixture to obtain a highly-oriented thermoelectric material.

FIG. 1 is a flowchart illustrating an embodiment of the method of preparing a highly-oriented thermoelectric material. Referring to FIG. 1, in operation S110, a mixture of a thermoelectric material matrix and a nano-metal is formed. Herein, the term "thermoelectric material matrix" refers to a material having thermoelectric properties and which is contained in an amount of greater than 50 percent by weight of the thermoelectric material.

For example, the thermoelectric material matrix may include at least one of tellurium (Te), bismuth (Bi), antimony (Sb), or selenium (Se), but is not limited thereto.

The nano-metal may be a metal having a melting point that is lower than the melting point of the thermoelectric material. The nano-metal may be, for example, Pb, Sn, or a combination thereof. For example, a mixture having a melting point that is lower than the melting point of $Bi_{0.5}Sb_{1.5}Te_3$ may be formed by mixing $Bi_{0.5}Sb_{1.5}Te_3$ as a thermoelectric material matrix with Pb or Sn as a nano-metal.

A precursor of the nano-metal may be, for example, a metal acetate. Because the metal acetate is easily combined with a thermoelectric alloy material, which has a surface that is mostly acidic and does not tend to cohere with the thermoelectric alloy material, the metal acetate may be easily distributed in the thermoelectric material matrix.

The mixture of the thermoelectric material matrix and the nano-metal may be obtained by dry mixing the precursor of the thermoelectric material matrix and the precursor of the nano-metal with a mortar or a ball mill. Because the nano-metal is melted at a temperature which is lower than the melting point of a corresponding bulk metal, a melting point of the mixture of the thermoelectric material matrix and the nano-metal is much lower (e.g., 100 degrees lower, specifically 50 degrees lower) than a melting point of a mixture of the thermoelectric material matrix and a corresponding bulk metal.

In operation S120, a mixture including the precursor of the nano-metal (e.g., the metal acetate) and the precursor of the thermoelectric material (e.g., at least one of tellurium (Te), bismuth (Bi), antimony (Sb), or selenium (Se) is heat-treated in an inert atmosphere using nitrogen gas ($N_2$) to prepare a nanogranular material in which the thermoelectric material matrix is combined with a nano-metal (e.g., a metal nanoparticle). Because an organic component of the precursor of the nano-metal (e.g., the metal acetate) is volatilized by the heat-treatment, the nanogranular structure in which the thermoelectric material matrix is combined with the metal nanoparticle is generated.

In operation S130, the mixture of the thermoelectric material matrix and the nano-metal is heat-treated and melted at a temperature higher than the melting point of the mixture of the thermoelectric material matrix and the nano-metal. The heat-treatment of the mixture of the thermoelectric material matrix and the nano-metal may be performed in a vacuum for about 1 minute to about 100 hours, specifically about 10 minutes to about 10 hours, more specifically about 30 minutes to about 1 hour.

A melting point of a mixture of two or more solids is closely related to a ratio of the solids. If a melting point of a thermoelectric material including a thermoelectric material matrix is reduced due to being mixed with a metal, a heat-treatment temperature which provides the thermoelectric material is reduced, thereby making it easier to perform a process of forming the thermoelectric material. Accordingly, a mixture ratio of the thermoelectric material matrix and the nano-metal is such that the melting point of the mixture of the thermoelectric material matrix and the nano-metal is reduced while the thermoelectric performance of the thermoelectric material is maintained or improved.

Figure 2:
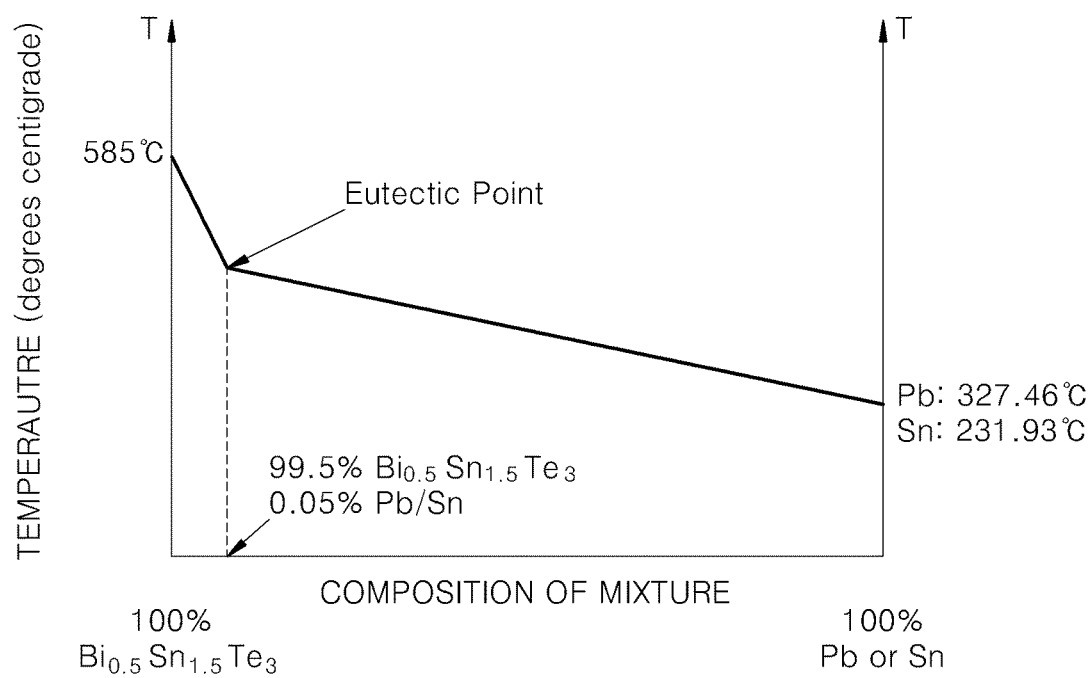
FIG. 2 is a phase diagram of temperature (degrees centigrade, ° C.) versus composition (percent of Pb or Sn in $Bi_{0.5}Sn_{1.5}Te_3$) illustrating a relationship between melting point and a ratio of a $Bi_{0.5}Sb_{1.5}Te_3$-based thermoelectric material to lead or tin.

FIG. 2 is a phase diagram illustrating a relationship between melting point and a ratio of a $Bi_{0.5}Sb_{1.5}Te_3$-based thermoelectric material and Pb or Sn. Referring to FIG. 2, a 100% $Bi_{0.5}Sb_{1.5}Te_3$-based thermoelectric material has a melting point of 585° C., and a mixture of 99.5% $Bi_{0.5}Sb_{1.5}Te_3$-based thermoelectric material and 0.5% Pb, which has a melting point of 327° C., or a mixture of 99.5% $Bi_{0.5}Sb_{1.5}Te_3$-based thermoelectric material and 0.5% Sn, which has a melting point of 231° C., has a melting point lower than 500° C. From this, a ratio of $Bi_{0.5}Sb_{1.5}Te_3$ to Pb or Sn may be between about 99.9:0.1 to about 95:5 weight %, specifically 99:1 to about 96:4 weight %, more specifically 98:2 to about 97:3 weight %.

Figure 3:
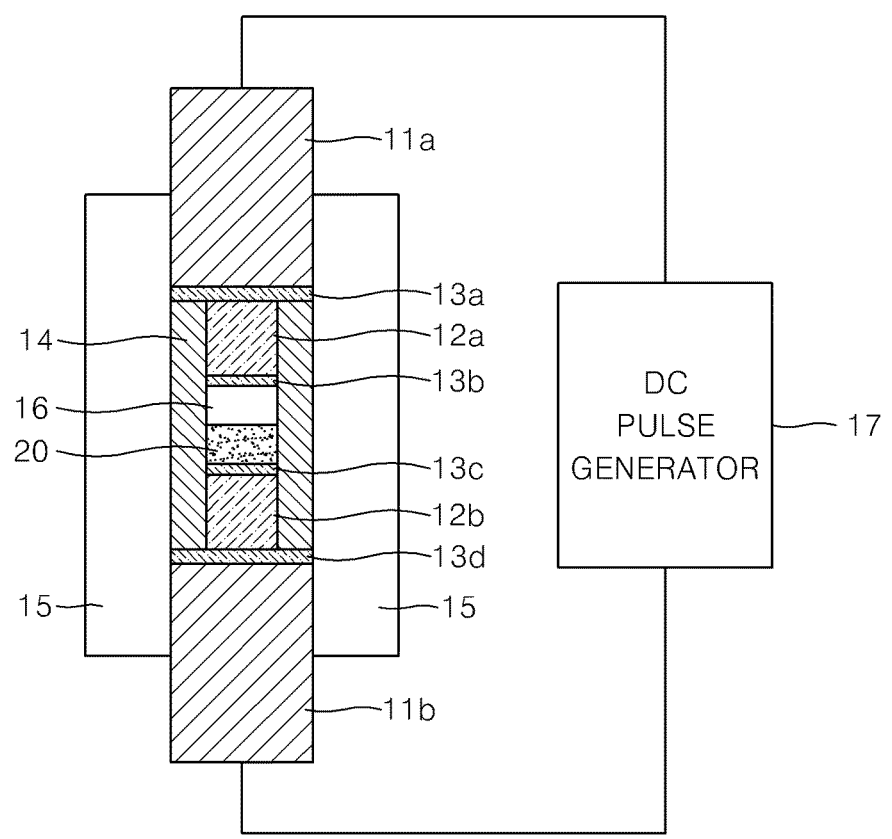
FIG. 3 is a cross-sectional view of an embodiment of a spark plasma sintering ("SPS") device.

The mixture of the thermoelectric material matrix and the nano-metal may be heat-treated by, for example, a spark plasma sintering ("SPS") device. FIG. 3 is a cross-sectional view of an embodiment of a SPS device. Referring to FIG. 3, first and second punches 12a and 12b are respectively on (e.g., connected to) upper and lower electrodes 11a and 11b, and first and second carbon sheets 13a and 13b, and first and second carbon sheets 13c and 13d are respectively on (e.g., attached to) the first and second punches 12a and 12b. A sample 20 is disposed in a space 16 defined by the second and third carbon sheets 13b and 13c and first and second molds 14 and 15. The upper and lower electrodes 11a and 11b are electrically connected to a direct current ("DC") pulse generator 17.

Unlike a commercially available sintering device, which provides heat using an external heating unit, when the sample 20 is conductive, the SPS device causes heat to be generated in the sample 20 by allowing a pulse DC current to flow through the first to fourth carbon sheets 13a, 13b, 13c, and 13d, the first and second carbon molds 14 and 15, and the sample 20. Accordingly, because the SPS device may provide a very high heating speed and a very high cooling speed, a very fast sintering process may be performed.

A method of melting the mixture of the thermoelectric material matrix and the nano-metal is not limited to a method using such an SPS device, and the mixture of the thermoelectric material matrix and the nano-metal may be melted by using any other method.

In operation S140, the melted mixture is cooled, solidified, and recrystallized. Although the thermoelectric material prepared by the method of FIG. 1 is polycrystalline, because the mixture is melted and then recrystallized, the thermoelectric material has a large grain size and a high degree of orientation, which is similar to a degree of orientation of a single-crystalline material, which is about 0.9.

Also, because the high degree of orientation, which is close to a degree of orientation of a single-crystalline material, may be obtained by heat-treating the mixture of the thermoelectric material matrix and the nano-metal at a temperature which is lower than the melting point of the thermoelectric material matrix for a short period of time (e.g., 2 hours, specifically 1 hour, more specifically 30 minutes), the method of preparing the thermoelectric material may be simplified.

The configuration and effect of the disclosed embodiment will be disclosed in greater detail with reference to the following example. The following example is for illustrative purposes only and shall not limit the scope of the present invention.

Example

A thermoelectric material matrix, p-type $Bi_{0.5}Sb_{1.5}Te_3$-based powder, was synthesized using an attrition mill, which is a device for mechanical alloying. For the synthesis, Bi, Sb, and Te, which were precursor elements of $Bi_{0.5}Sb_{1.5}Te_3$, and steel balls each having a diameter of 5 mm, wherein a weight ratio of the precursor elements to the steel balls was 1:20, were put into a jar formed of a stainless steel. Argon (Ar) or nitrogen ($N_2$) gas, as an inert gas, was directed into the jar in order to prevent oxidation of the raw elements and the steel balls. An impeller formed of a stainless steel was rotated in the jar at a speed of 500 revolutions per minute ("rpm"). In order to prevent oxidation of the precursor elements and the steel balls caused by heat generated by the milling, cooling water was circulated around the jar.

Pb-acetate (lead(II)-acetate, $Pb(CH_3COO)_2$) was added to the $Bi_{0.5}Sb_{1.5}Te_3$-based powder at a ratio of 0.5 weight % Pb and dry mixed with the $Bi_{0.5}Sb_{1.5}Te_3$-based powder by using a mortar or a ball mill. In general, because the metal acetate is easily combined with a thermoelectric alloy material having a surface that is mostly acidic and does not tend to cohere with the thermoelectric alloy material, the metal acetate is easily distributed.

The mixture of the $Bi_{0.5}Sb_{1.5}Te_3$-based powder and the Pb-acetate was heat-treated for 3 hours at a temperature of 300° C. under an inert atmosphere of $N_2$ to obtain a nanogranular structure in which $Bi_{0.5}Sb_{1.5}Te_3$, which was the thermoelectric material matrix, was combined with Pb particles. Because an organic component was volatilized during the heat-treatment, the granular structure in which the thermoelectric matrix was combined with the Pb particles was generated.

Figure 4:
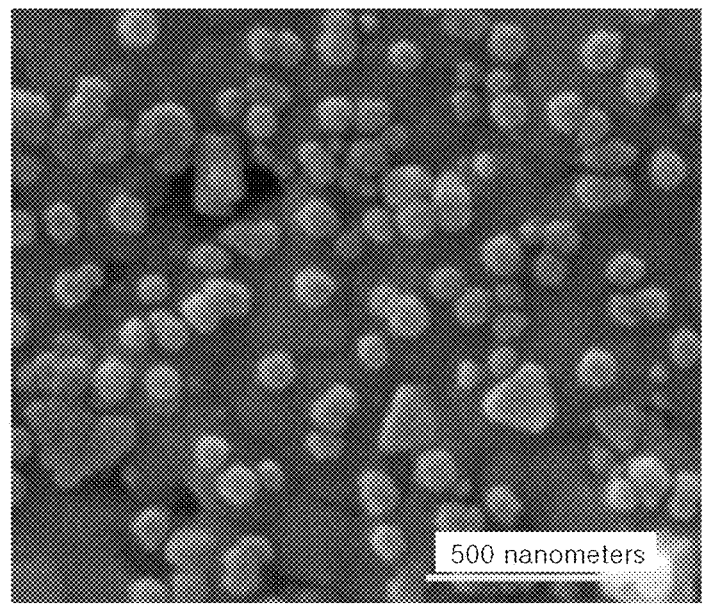
FIG. 4 is a scanning electron microscope ('SEM') image of an embodiment of a nanogranular structure in which a metal nanoparticle is combined with a powder of a thermoelectric material matrix.

FIG. 4 is a scanning electron microscope ("SEM") image of the nanogranular structure obtained after the heat-treatment. FIG. 4 illustrates the granular structure in which the Pb particles, each having a size of several nanometers, are distributed over and combined with a surface of the $Bi_{0.5}Sb_{1.5}Te_3$-based powder, which has particles having a size of several micrometers.

Figure 5:
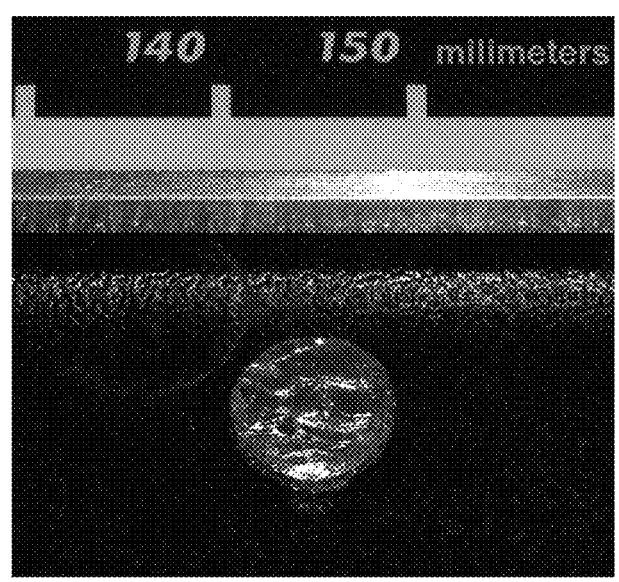
FIG. 5 is an optical image of an embodiment of a $Bi_{0.5}Sb_{1.5}Te_3$-based bulk thermoelectric material including 0.5 weight % Pb.

The nanogranular structure was loaded into a graphite mold of an SPS device, heat-treated for 30 minutes at a temperature of 500° C. in a vacuum (e.g., $10^{-2}$ torr or less), and cooled to obtain a $Bi_{0.5}Sb_{1.5}Te_3$-based bulk thermoelectric material including 0.5 weight % of Pb. FIG. 5 is an optical image of the $Bi_{0.5}Sb_{1.5}Te_3$-based bulk thermoelectric material including 0.5 weight % of Pb. Referring to FIG. 5, the $Bi_{0.5}Sb_{1.5}Te_3$-based bulk thermoelectric material including 0.5 weight % of Pb has a thick disk shape and has a shiny surface.

Figure 6A:
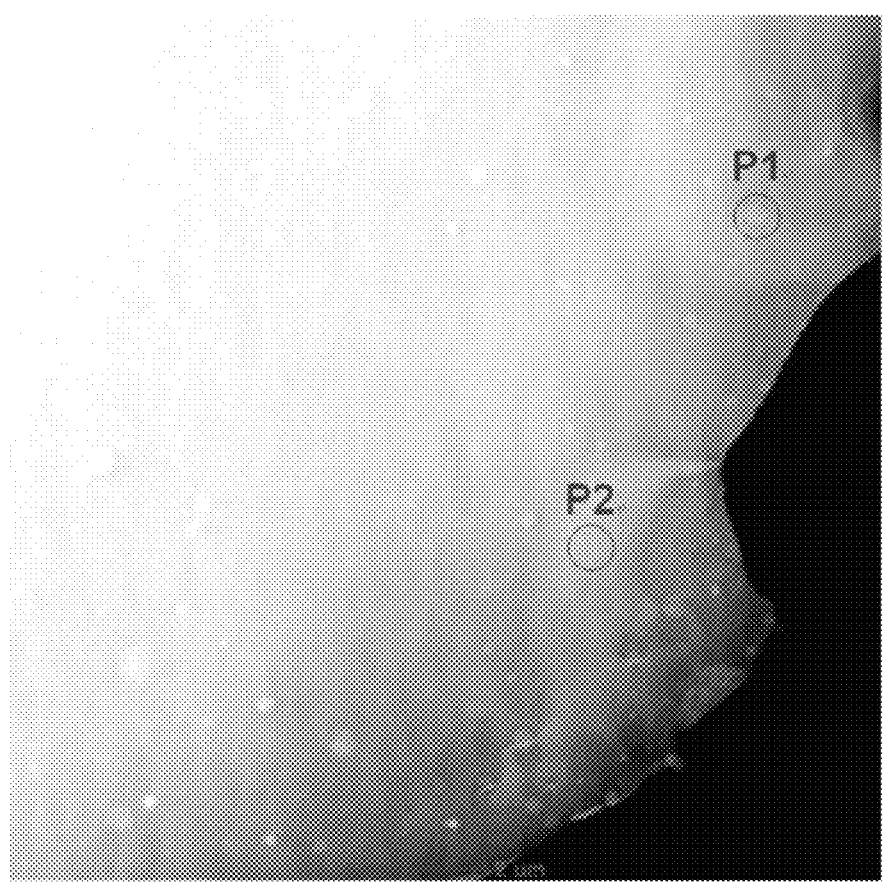
FIG. 6A is a transmission electron microscope ("TEM") image of a $Bi_{0.5}Sb_{1.5}Te_3$-0.5 weight % Pb bulk thermoelectric material.
Figure 6B:
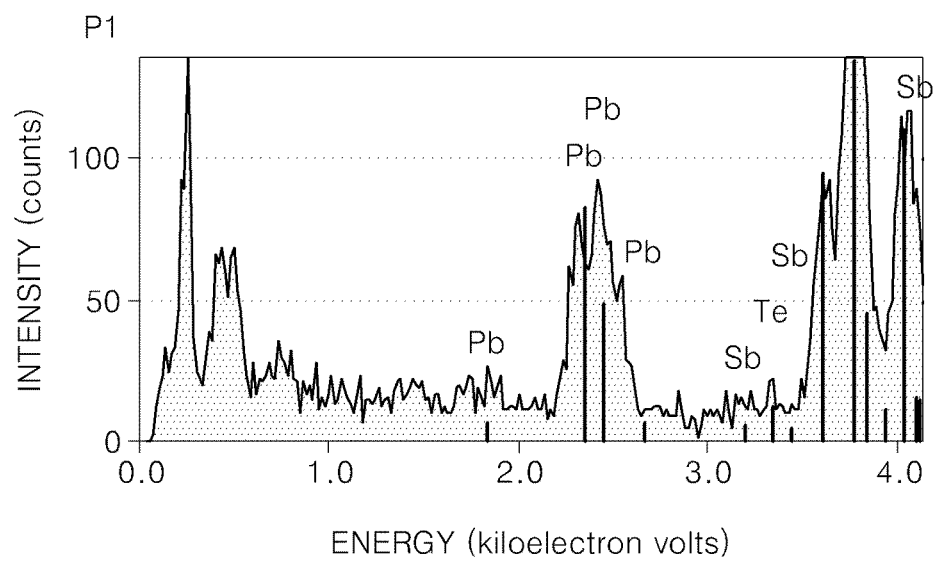
FIG. 6B is an a graph of intensity (counts) versus energy (kiloelectron volts) showing energy dispersive spectroscopy ("EDS") results of region P1 of FIG. 6A.
Figure 6C:
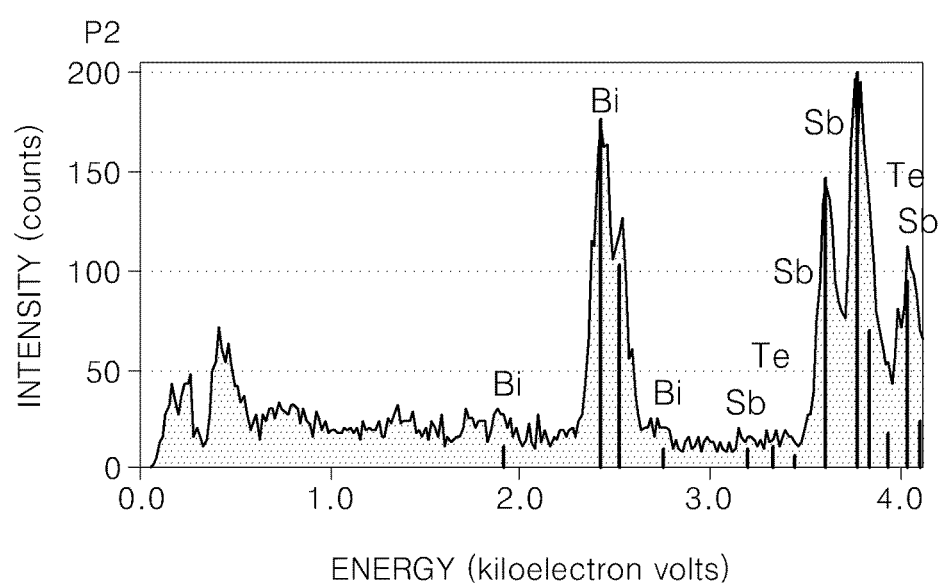
FIG. 6C is an a graph of intensity (counts) versus energy (kiloelectron volts) showing energy dispersive spectroscopy ("EDS") results of region P2 of FIG. 6A.

FIG. 6A is a transmission electron microscope ("TEM") image of the $Bi_{0.5}Sb_{1.5}Te_3$-based bulk thermoelectric material including 0.5 weight % of Pb, FIG. 6B is an an graph of energy dispersive spectroscopy ("EDS") results of region P1 indicated of FIG. 6A, and FIG. 6C is an an graph of EDS results of region P2 indicated of FIG. 6A. Referring to FIG. 6A, it is found that because a grain boundary is not observed, grains having a size greater than tens of micrometers have been formed. Also, it was found using an energy dispersive spectrometer that a white spot in the TEM image, such as white spot P1, comprises primarily Pb. It was also found that each white spot has a size of tens of nanometers and is distributed within a grain. It was also found by using the energy dispersive spectrometer that portions P2, which are portions of the grain other than the white spots (e.g., white spot P1), are $Bi_{0.5}Sb_{1.5}Te_3$. Accordingly, it may be determined that because the Pb nanoparticles are uniformly distributed in the $Bi_{0.5}Sb_{1.5}Te_3$, which is the thermoelectric material matrix, the Pb nanoparticles reduce the melting point of $Bi_{0.5}Sb_{1.5}Te_3$, and a highly-oriented bulk thermoelectric material may be synthesized by melting and recrystallizing the thermoelectric material.

Comparative Example

As in the Example, the thermoelectric material matrix p-type $Bi_{0.5}Sb_{1.5}Te_3$-based powder was synthesized using an attrition mill. For the synthesis, Bi, Sb, and Te, which were precursor elements of $Bi_{0.5}Sb_{1.5}Te_3$, and steel balls, each having a diameter of 5 mm, wherein a weight ratio of the precursor elements to the steel balls was 1:20, were put into a jar formed of a stainless steel, and an Ar or $N_2$ gas was directed into the jar in order to prevent oxidation of the precursor elements and the steel balls. An impeller formed of a stainless steel was rotated in the jar at a speed of 500 rpm. In order to prevent oxidation of the precursor elements and the steel balls caused by heat generated during the rotation, cooling water was circulated around the jar.

As in the Example, Pb-acetate was added to the $Bi_{0.5}Sb_{1.5}Te_3$-based powder at a ratio of 0.5 weight % Pb and dry mixed with the $Bi_{0.5}Sb_{1.5}Te_3$-based powder using a mortar or a ball mill.

As in the Example, the mixture of the $Bi_{0.5}Sb_{1.5}Te_3$-based powder and the Pb-acetate was heat-treated for 3 hours at a temperature of 300° C. under an inert atmosphere of $N_2$ to obtain a nanogranular structure in which $Bi_{0.5}Sb_{1.5}Te_3$, which was the thermoelectric material matrix, was combined with Pb particles.

The nanogranular structure was loaded into a graphite mold of an SPS device, heat-treated at a temperature of 380° C. and at a pressure of 70 megaPascals ("MPa"), and cooled to obtain a $Bi_{0.5}Sb_{1.5}Te_3$-based bulk thermoelectric material. The heat-treatment temperature, 380° C., is lower than the melting point of the mixture of the $Bi_{0.5}Sb_{1.5}Te_3$-based thermoelectric material and Pb. Accordingly, the $Bi_{0.5}Sb_{1.5}Te_3$-based bulk thermoelectric material including 0.5 weight % of Pb prepared according to the Comparative Example was formed by hot pressing without undergoing melting and recrystallization.

Measurement of X-Ray Diffraction ("XRD")

A powder was formed by using a portion of the thermoelectric material manufactured according to the Example, and another powder was formed using a portion of the thermoelectric material manufactured according to the Comparative Example. An XRD pattern of each powder was measured by using an X-ray powder diffractometer.

Figure 7:
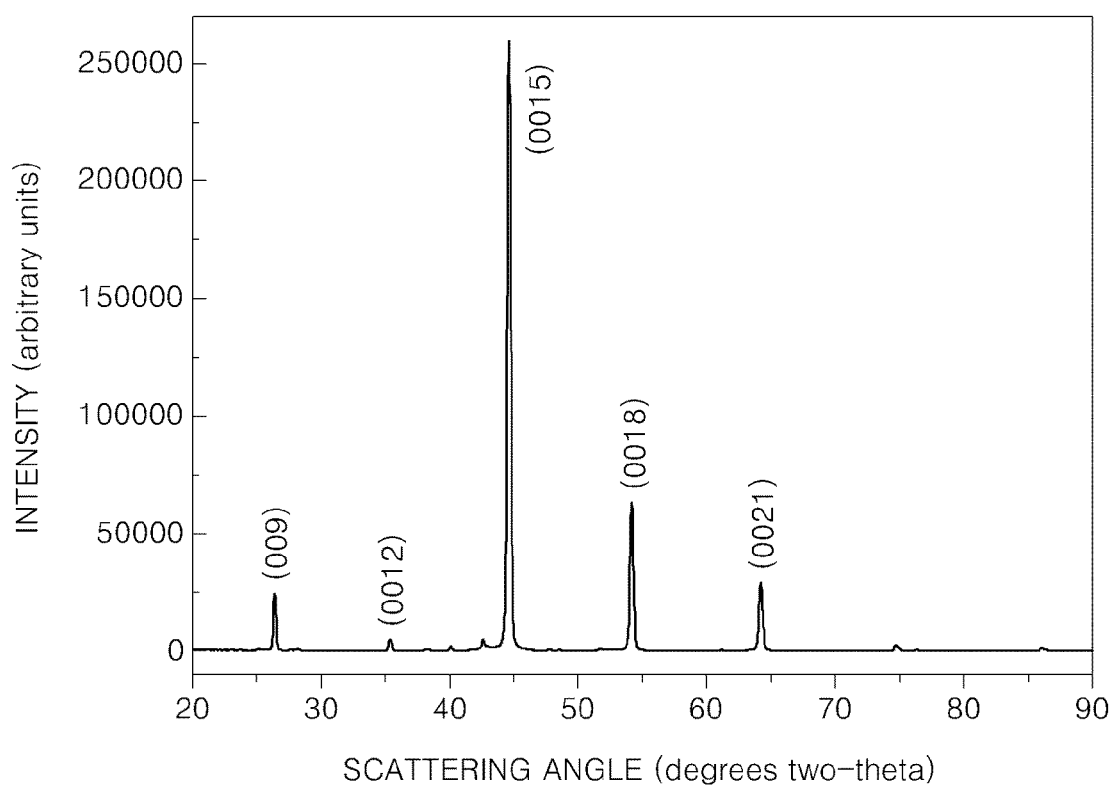
FIG. 7 is a graph of intensity (arbitrary units) versus scattering angle (degrees two-theta, 2θ) illustrating an X-ray diffraction ("XRD") pattern of an embodiment of a $Bi_{0.5}Sb_{1.5}Te_3$-based bulk thermoelectric material prepared according to the Example.
Figure 8:
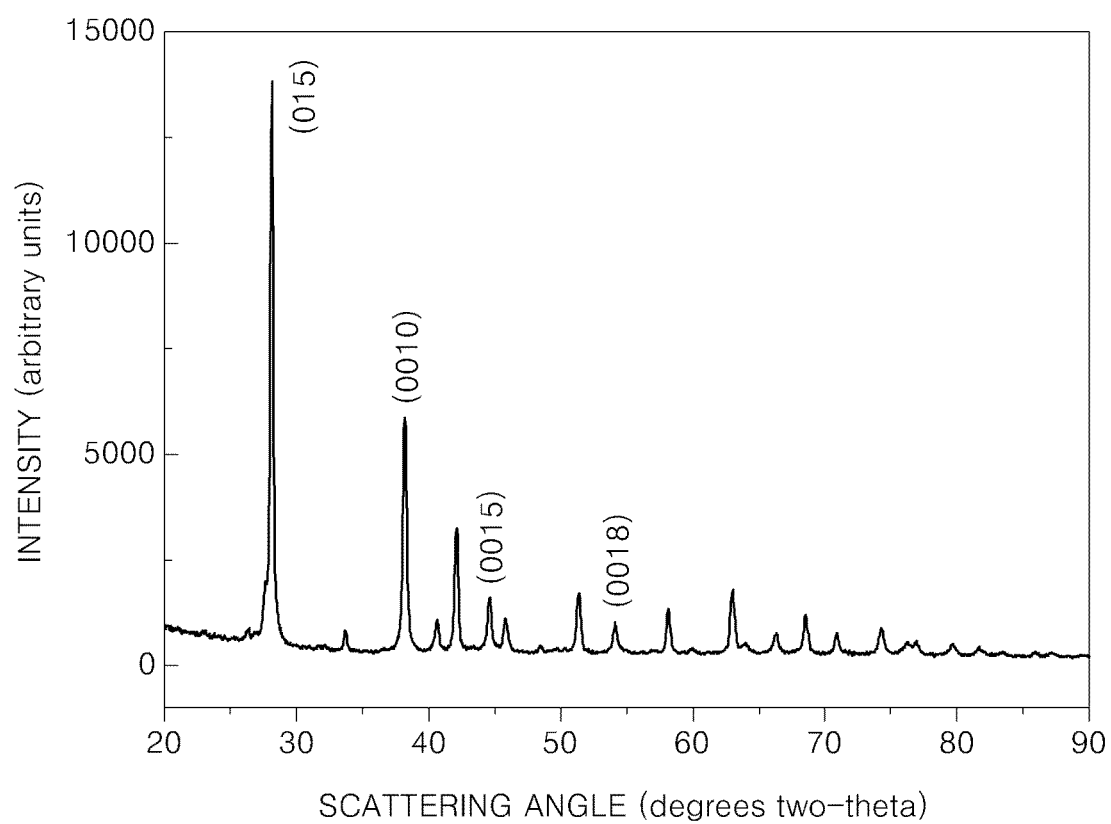
FIG. 8 is a graph of intensity (arbitrary units) versus scattering angle (degrees two-theta, 2θ) illustrating an XRD pattern of an embodiment of a $Bi_{0.5}Sb_{1.5}Te_3$-based bulk thermoelectric material prepared according to the Comparative Example.

FIG. 7 illustrates an XRD pattern of the $Bi_{0.5}Sb_{1.5}Te_3$-based bulk thermoelectric material prepared according to the Example. FIG. 8 is an XRD pattern of the $Bi_{0.5}Sb_{1.5}Te_3$-based bulk thermoelectric material prepared according to the Comparative Example. Each of the $Bi_{0.5}Sb_{1.5}Te_3$-based bulk thermoelectric materials prepared respectively by the Example and the Comparative Example includes 0.5 weight % of Pb.

Because all of peaks of the XRD pattern of FIG. 7 are peaks in a (00/) direction, it is found that grains of the $Bi_{0.5}Sb_{1.5}Te_3$-based bulk thermoelectric material of the Example are arranged in a c-axis direction. However, because peaks in a (015) and an (0010) direction in the XRD pattern of FIG. 8 have an intensity much greater than that of the peak in the (00/) direction, and a greater number of peaks are shown, it is found that the $Bi_{0.5}Sb_{1.5}Te_3$-based bulk thermoelectric material of the Comparative Example has a low degree of orientation.

Lotgering indexes of the $Bi_{0.5}Sb_{1.5}Te_3$-based bulk thermoelectric materials of the Example and the Comparative Example were calculated by using the XRD data. Table 1 shows the XRD data of the Example. A ratio P, obtained by dividing a sum $\Sigma I(HKL)$ of X-ray diffraction strengths in the (001) direction by a sum $\Sigma I(hkl)$ of X-ray diffraction strengths in all directions, calculated from the data of Table 1 is 0.92. Because a Lotgering index is given by $F=\{(P-P_O)/(1-P_O)\}\times 100\%$, $P_O$ is much less than (e.g., <<) 1, and $P_O$ is much less than (e.g., <<) P, wherein $P_O$ is a ratio for a non-oriented polycrystalline sample. Thus in the Example $(P-P_O)/(1-P_O)$ is approximately equal to P. Also, the Lotgering index F is almost the same as a value obtained by multiplying the ratio P by 100. Accordingly, it is found that the $Bi_{0.5}Sb_{1.5}Te_3$-based bulk thermoelectric material of Example has a Lotgering index of 92% and a high degree of orientation.

TABLE 1

| Angle (2θ) | Intensity (I) | Miller index (hkl) |
|---|---|---|
| 25.20 | 91 | |
| 26.37 | 6159 | |
| 27.68 | 108 | (0 0 9) |
| 28.17 | 275 | |
| 35.38 | 1344 | (0 0 12) |
| 38.26 | 176 | |
| 40.09 | 421 | |
| 42.62 | 730 | |
| 44.63 | 74257 | (0 0 15) |
| 51.70 | 176 | |
| 54.19 | 19887 | (0 0 18) |
| 64.18 | 10189 | (0 0 21) |
| 74.75 | 891 | |
| 86.12 | 581 | |
| ΣI(HKL) | 105785 | |
| ΣI(hkl) | 115284 | |
| P = ΣI(HKL)/ΣI(hkl) | 0.92 | |

Table 2 shows XRD data of Comparative Example. A ratio P obtained by dividing a sum ΣI(HKL) of X-ray diffraction strengths in the (00/) direction by a sum ΣI(hkl) of X-ray diffraction strengths in all directions calculated from the data of Table 2 is 0.082. Accordingly, it is found that the $Bi_{0.5}Sb_{1.5}Te_3$-based bulk thermoelectric material of Comparative Example has almost no degree of orientation. That is, the $Bi_{0.5}Sb_{1.5}Te_3$-based bulk thermoelectric material of Comparative Example is almost non-oriented. When the Lotgering index $F=\{(P-P_O)/(1-P_O)\}\times 100\%$ of the $Bi_{0.5}Sb_{1.5}Te_3$-based bulk thermoelectric material of Example is calculated again by using the ratio P of Comparative Example, 91% is obtained, which is very similar to P of the $Bi_{0.5}Sb_{1.5}Te_3$-based bulk thermoelectric material of the Example (92%).

TABLE 2

| Angle (2θ) | Intensity (I) | Miller index (hkl) |
|---|---|---|
| 26.33 | 81 | |
| 27.66 | 234 | (0 0 9) |
| 28.13 | 3932 | |
| 33.69 | 133 | |
| 38.19 | 1896 | |
| 40.60 | 212 | |
| 42.09 | 871 | |
| 44.59 | 422 | (0 0 15) |
| 45.80 | 305 | |
| 48.47 | 51 | |
| 51.36 | 508 | |
| 54.12 | 240 | (0 0 18) |
| 58.14 | 368 | |
| 59.91 | 41 | |
| 62.98 | 562 | |
| 66.25 | 214 | |
| 68.51 | 343 | |
| 70.86 | 189 | |
| 74.28 | 268 | |
| ΣI(HKL) | 896 | |
| ΣI(hkl) | 10870 | |
| P = ΣI(HKL)/ΣI(hkl) | 0.082% | |

Measurement of Electrical Conductivity

Electrical conductivities of the thermoelectric materials were measured at temperatures between 320 K and 520 K by using a direct current ("DC") 4-point probe method.

Figure 9:
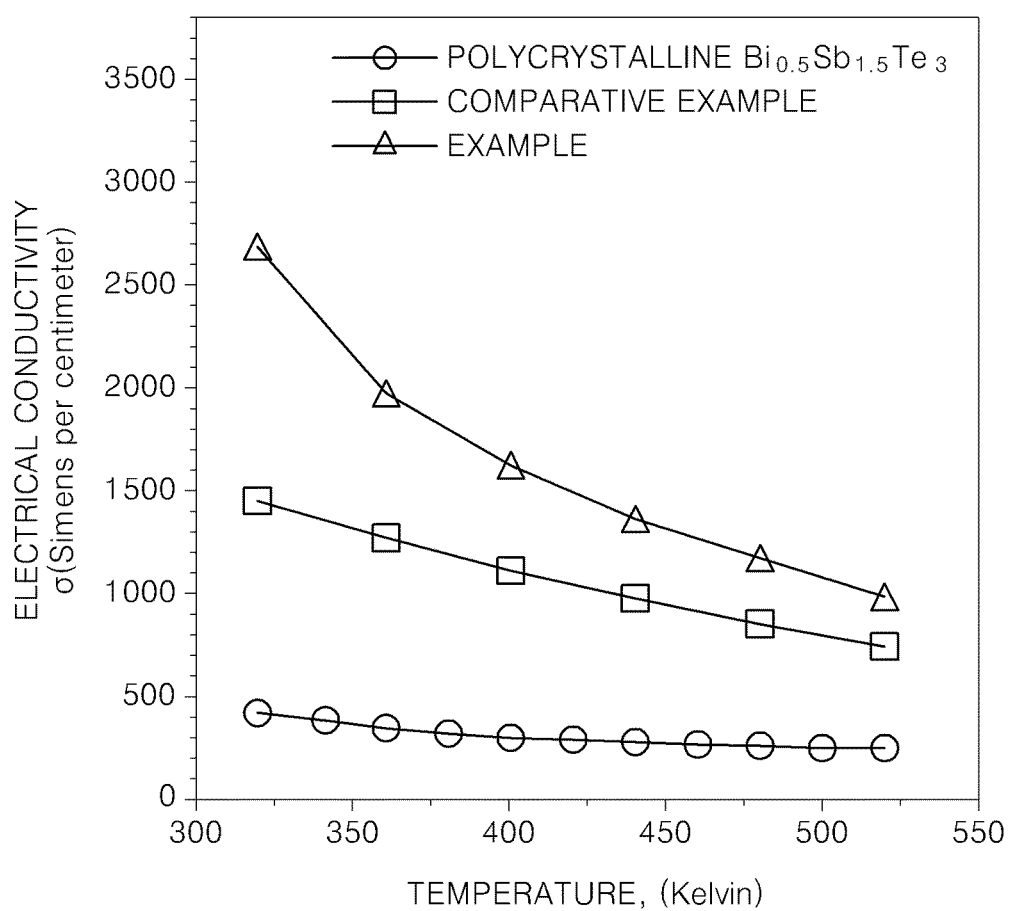
FIG. 9 is a graph of electrical conductivity (siemens per centimeter) versus temperature (Kelvin, K) illustrating a relationship between temperature and electrical conductivity of the thermoelectric material of the Example, the thermoelectric material of the Comparative Example, and a non-oriented polycrystalline $Bi_{0.5}Sb_{1.5}Te_3$-based thermoelectric material that does not include Pb.

FIG. 9 is a graph illustrating a relationship between temperature and electrical conductivity of the thermoelectric material of the Example (triangles), the thermoelectric material of the Comparative Example (squares), and a non-oriented polycrystalline $Bi_{0.5}Sb_{1.5}Te_3$-based thermoelectric material (circles) which does not include Pb. Referring to FIG. 9, the electrical conductivity of the non-oriented polycrystalline $Bi_{0.5}Sb_{1.5}Te_3$ thermoelectric material without Pb has the lowest electrical conductivity, the electrical conductivity of the thermoelectric material of the Comparative Example prepared by hot pressing has the second lowest electrical conductivity, and the electrical conductivity of the thermoelectric material of the Example has the highest electrical conductivity. The electrical conductivity of the thermoelectric material of the Example is about 80% and about 25% higher than the electrical conductivity of the thermoelectric material of the Comparative Example at temperatures of 320 K and 520 K, respectively.

While not wanting to be bound by theory, the high electrical conductivity of the thermoelectric material of the Example seems to result from an increase in charge carrier mobility due to a high degree of orientation.

As described above, according to an embodiment, a thermoelectric material having a high Lotgering degree of orientation (e.g., greater than 0.9) may be provided. The thermoelectric material having the high degree of orientation may have improved electrical conductivity due to an increase in charge carrier mobility, thereby improving thermoelectric performance.

Furthermore, because a thermoelectric material matrix and a nano-metal are mixed to reduce a melting point, and the mixture of the thermoelectric material matrix and the nano-metal is melted and then recrystallized, the thermoelectric material having the high degree of orientation may be prepared in a shorter time and in a simpler process.

It should be understood that the exemplary embodiments disclosed herein should be considered in a descriptive sense only and not for purposes of limitation. Descriptions of features, advantages, or aspects within each embodiment should be considered as available for other similar features, advantages, or aspects in other embodiments.

What is claimed is:

1. A method of preparing a thermoelectric material, the method comprising:
    contacting a thermoelectric material matrix comprising Bi and Te and a precursor of a nano-metal, which has a melting point which is lower than a melting point of the thermoelectric material matrix, to form a combination comprising the nano-metal;
    melting the combination; and
    recrystallizing the melted combination to form the thermoelectric material,
    wherein the thermoelectric matrix comprises Bi and Te, and
    wherein the thermoelectric material has a average grain size of about 100 micrometers to about 5 millimeters.

2. The method of claim 1, wherein the contacting comprises:
    providing a powder of the thermoelectric material matrix;
    contacting the precursor of the nano-metal with the powder of the thermoelectric material matrix to obtain a mixed material; and
    heat-treating the mixed material in a reducing atmosphere to form the combination, which has a nano-granular structure.

3. The method of claim 1, wherein a ratio of the thermoelectric material matrix and the nano-metal is such that the combination has a melting point equal to or less than about 500° C. and the thermoelectric material has an electrical conductivity of more than 2500 siemens per centimeter at 320 Kelvin.

4. The method of claim 2, wherein the contacting of the precursor of the nano-metal with the powder of the thermoelectric material matrix comprises dry mixing the precursor of the nano-metal with the powder of the thermoelectric material matrix with a mortar or a ball mill.

5. The method of claim 1, wherein the thermoelectric material matrix is a Bi—Te-based material.

6. The method of claim 5, wherein the thermoelectric material matrix is $Bi_{0.5}Sb_{1.5}Te_3$.

7. The method of claim 5, wherein the nano-metal is Pb, Sn, or a combination comprising at least one of the foregoing.

8. The method of claim 1, wherein the precursor of the nano-metal is a metal acetate.

9. The method of claim 5, wherein the precursor of the nano-metal is lead(II) acetate, tin(II) acetate, or a combination comprising at least one of the foregoing.

10. The method of claim 1, wherein the melting of the combination comprises melting the combination with a spark plasma sintering device.

11. The method of claim 10, wherein the melting of the combination comprises melting the combination in a vacuum.

12. The method of claim 9, wherein the melting of the combination comprises melting the combination at a temperature lower than about 500° C.

13. The method of claim 1, wherein a Lotgering degree of orientation in a c-axis direction of the thermoelectric material is about 0.9 to about 1.

* * * * *